United States Patent
Yu et al.

(10) Patent No.: US 12,066,502 B2
(45) Date of Patent: Aug. 20, 2024

(54) OPEN PHASE DETECTION

(71) Applicant: Caterpillar Inc., Peoria, IL (US)

(72) Inventors: Dachuan Yu, Dunlap, IL (US);
Gregory J Speckhart, Peoria, IL (US);
Jesse R Gerdes, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 362 days.

(21) Appl. No.: 17/502,819

(22) Filed: Oct. 15, 2021

(65) Prior Publication Data
US 2023/0121559 A1   Apr. 20, 2023

(51) Int. Cl.
*G01R 31/62*   (2020.01)
*H02H 1/00*   (2006.01)
*H02H 7/04*   (2006.01)

(52) U.S. Cl.
CPC ......... *G01R 31/62* (2020.01); *H02H 1/0007* (2013.01); *H02H 7/04* (2013.01)

(58) Field of Classification Search
CPC .......... G01R 31/62; H02H 7/04; H02H 7/045; H02H 1/0007
See application file for complete search history.

(56) References Cited

U.S. PATENT DOCUMENTS 5,602,707 A * 2/1997 Schweitzer, III ...... H02H 3/046
                                                        361/85
10,132,875 B1 * 11/2018 McAnelly .............. G01R 31/62
10,931,094 B2   2/2021 Arritt et al.
2016/0291063 A1 * 10/2016 Blake ..................... G01R 31/66
2018/0149691 A1 * 5/2018 Blake ..................... H02H 1/0007

FOREIGN PATENT DOCUMENTS

WO   WO-2016019491 A1 *  2/2016   ........... H02H 7/1227

OTHER PUBLICATIONS

Amir Norouzi "Open Phase Conditions in Transformers Analysis and Protection Algorithm" 2012 GE Digital Energy.*

* cited by examiner

*Primary Examiner* — Vincent H Tran
(74) *Attorney, Agent, or Firm* — Lee & Hayes

(57) ABSTRACT

An example transformer includes a controller that determines the currents on a power grid side of the transformer, as well as an inverter/load side of the transformer. The transformer may be of a delta-wye configuration. The controller compares the currents on the delta side of the transformer to the currents on the wye side of the transformer to determine whether the currents on either side are imbalanced. If the currents on the delta side are balanced, while the currents on the wye side are imbalanced, then the controller may determine that an open phase condition exists on the wye side of the transformer. Alternatively, if the currents on the delta side are imbalanced or if the currents on the delta side are balanced and the currents on the wye side are also balanced, then the controller determines that no open phase condition exists.

20 Claims, 3 Drawing Sheets

OPEN PHASE DETECTION

TECHNICAL FIELD

The present disclosure relates to open phase detection. More specifically, the present disclosure relates to detecting an open phase connection of a transformer connected to a power grid.

BACKGROUND

Transformers, such as delta-wye configured transformers, are commonly used to couple electrical components, such as power providing components and/or loads to a power grid. For example, a delta-wye transformer may be used to couple one or more inverters, one or more alternating current (AC) to direct current (DC) convertors (AC-to-DC convertors), other power sources, and/or other loads to a power grid. In some cases, one or more inverters may be connected to a low voltage side of the delta-wye transformer for the purpose of providing power to the power grid. In other cases, other loads may be connected to the delta-wye transformer, such that power from the power grid is provided to a load, such as one or more industrial equipment. Generally, the power grid may provide and/or receive power (voltage and current) in one or more phases, such as three phases separated by 120° (2π/3 radians).

In some cases, one or more phases may not be available on the power grid side of the transformer, resulting in an open phase condition. Providing power to the power grid or drawing power from the power grid during an open phase condition may be dangerous and may result in damage to equipment. Additionally, regulations may require disconnecting from the power grid when an open phase condition is detected. Thus, it may be desirable to monitor for and identify when an open phase condition occurs.

An example of identifying an open phase condition is described in U.S. Pat. No. 10,931,094 (hereinafter referred to as the '094 reference), where detecting an open phase condition on a grounded-wye high voltage side of a transformer is disclosed. For example, an open connector on the grid side of a transformer may be detected with the processes of the '094 reference. However, this process of the '094 reference requires an injection signal into a neutral connection to actively monitor for an open phase condition on the grid side of the transformer. Thus, the disclosed process of the '094 reference involves additional steps and requires generating additional signals for performing the open phase analysis, which can increase cost of monitoring for the open phase condition.

Example embodiments of the present disclosure are directed toward overcoming the deficiencies described above.

SUMMARY

In an example of the disclosure, a method of detecting an open phase condition includes determining a first current value, a second current value, and a third current value associated with a first side of a transformer, determining a fourth current value, a fifth current value, and a sixth current value associated with a second side of the transformer, and determining that the first current value, the second current value, and the third current value are imbalanced. The method further includes determining that the fourth current value, the fifth current value, and the sixth current value are balanced and determining, based at least in part on first current value, the second current value, and the third current value being imbalanced and the fourth current value, the fifth current value, and the sixth current value being balanced, that an open phase condition exists on the first side of the transformer.

In another example of the disclosure, a system includes a transformer having a power grid side and an inverter/load side and a controller configured to determine a first current value, a second current value, and a third current value associated with power grid side of the transformer and determine a fourth current value, a fifth current value, and a sixth current value associated with inverter/load side of the transformer. The controller is further configured to determine that the first current value, the second current value, and the third current value are imbalanced, determine that the fourth current value, the fifth current value, and the sixth current value are balanced, and determine, based at least in part on first current value, the second current value, and the third current value being imbalanced and the fourth current value, the fifth current value, and the sixth current value being balanced, that an open phase condition exists on the power grid side of the transformer In still another example of the disclosure, a system includes a transformer having a wye side and a delta side and a controller configured to determine, at a first time, a first current value of a first phase on the wye side, a second current value of a second phase on the wye side, and a third current value of a third phase on the wye side and determine, at the first time, a fourth current value of the first phase on the delta side, a fifth current value of the second phase on the delta side, and a sixth current value of the third phase on the delta side. The controller is further configured to determine that the first current value, the second current value, and the third current value are imbalanced, determine that the fourth current value, the fifth current value, and the sixth current value are imbalanced, and determine, based at least in part on first current value, the second current value, and the third current value being imbalanced and the fourth current value, the fifth current value, and the sixth current value being imbalanced, that the transformer is operating without an open phase condition at the first time.

DETAILED DESCRIPTION

Wherever possible, the same reference numbers will be used throughout the drawings to refer to the same or like parts.

Figure 1:
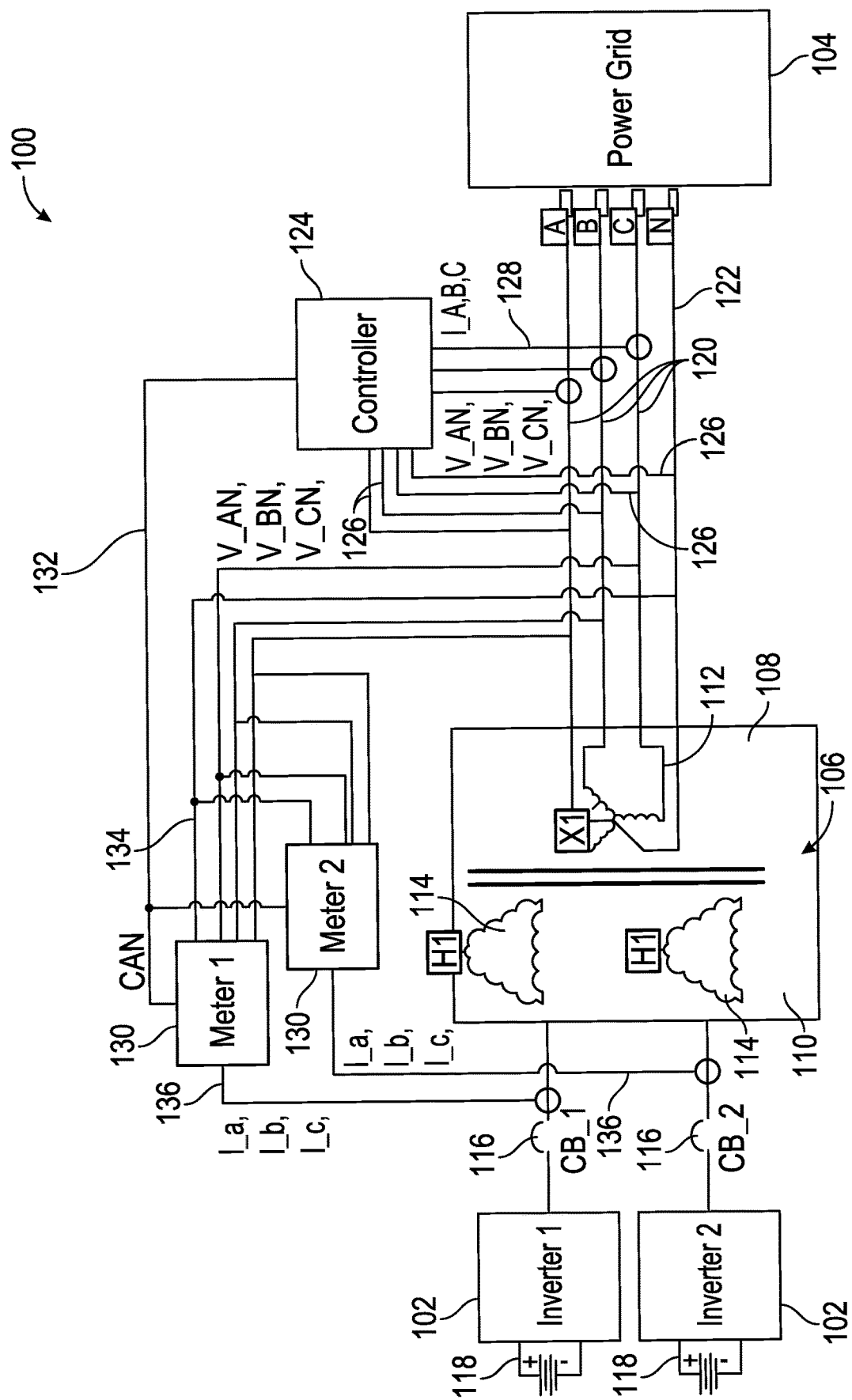
FIG. 1 is a schematic illustration of an example environment with one or more inverters connected to a power grid via a transformer, in accordance with examples of the disclosure.

FIG. 1 is a schematic illustration of an example environment 100 with one or more inverters 102 connected to a power grid 104 via a transformer 106, in accordance with examples of the disclosure. The transformer 106 includes a power grid side 108 or high voltage side and an inverter/load side 110 or low voltage side. Although depicted as a stepdown transformer, according to examples of the disclosure, the transformer 106 may be a step-up transformer and/or a unity transformer. The transformer 106 may include any suitable power grid side winding configurations, such as one or more wye winding 112, also referred to as wye 112. Additionally, the transformer 106 may include any suitable inverter/load side winding configurations, such as one or more delta winding 114, also referred to as delta 114. Although a single wye 112 and two delta 114 are depicted here, it should be understood that there may be any suitable number of wye windings 112 and/or any suitable number of delta windings 114. Furthermore, the transformer 106 may have different configurations, such as a wye-wye configuration, a wye-delta configuration, a delta-delta configuration, or the like. According to examples of the disclosure, an open phase condition on the power grid side 108 of the transformer 106 may be detected by the systems and processes described herein.

The power grid 104 includes any suitable shared power infrastructure, such as any variety of public or private electrical power distribution systems. In some cases, the power grid 104 may include one or more national and/or regional power distribution grid systems. The power grid 104 may supply power with three phases A, B, and C relative to ground or neutral (N). The supplied power on each of the phases are of any suitable power level, voltage, and/or current. The voltage and current on each of the phases are separated by 120° (2π/3 rad). In some cases, the primary frequency of the current provided by the power grid may be 60 Hertz (Hz), 50 Hz, or any suitable frequency.

The inverter/load side 110 of the transformer 106 may be connected to the inverters 102 via one or more circuit breakers 116 or fuses. If currents (I_A, I_B, and/or I_C) that are beyond acceptable thresholds values between the transformer 106 and the inverters 102, then the circuit breakers 116 may disconnect the inverters 102 from the transformer 106. In this manner, the circuit breakers 116 may protect the transformer 106, inverters 102, and/or the power grid 104 from operating outside of their rated operating conditions.

The inverter 102 may be any suitable device that provides a DC-to-AC conversion of electrical power. For example, inverters 102 may receive DC current from any variety of suitable sources, such as batteries 118. Alternatively, the inverters 102 may receive power from solar cells, fuel cells, generators, or other suitable point-of-use power source(s). The inverters 102 may transform the DC incoming power, such as from the batteries 118, to AC power with frequency and phases that match the power that is available on the power grid 104. For example, the inverters 102 may transform DC power from the batteries 118 to three-phase AC power that can be provided to the power grid. Alternatively, the delta winding(s) 114 of the transformer 106 may be connected to a load that is powered by the power grid 104. In this case, power may be received from the power grid 104, rather than provided to the power grid 104.

Regardless of whether the transformer 106 is providing power to a load or is providing power to the power grid 104 from one or more inverters 102, it is desirable to identify when an open phase condition has occurred. The open phase condition, as used here, refers to a condition where at least one phase A, B, C from the power grid may be disconnected, or otherwise unavailable. Detection of an open phase may be important to prevent damage to equipment, such as inverter 102, and/or to prevent imbalances in the power grid 104. Furthermore, grid codes for connecting to a power grid 104 may require monitoring of open phase conditions and may require disconnection from the power grid 104 if an open phase condition is detected. However, detection of an open phase condition on the transformer 106 may be difficult, particularly for delta-wye type transformers, and particularly when operating under low-load conditions. Merely measuring the voltage and/or the current on the power grid side 108 of the transformer 106 may not suffice in detecting an open phase condition, because the voltage is regenerated on the wye winding 112 of the transformer 106 due to magnetic flux in a transformer core. According to embodiments of the disclosure, an open phase condition may be detected by comparing the currents on the power grid side 108 of the transformer 106 and the currents on the inverter/load side 110 of the transformer 106.

As shown, each of the phases A, B, and C of the power grid 104 may be connected to the transformer 106 via connectors 120. Additionally, ground, or neutral, is connected to the transformer 106 via connector 122. In some cases, if one of the connectors 120, 122 are improperly connected, an open phase condition may arise. In other cases, other phenomena may give rise to an open phase condition on the power grid side 108 of the transformer 106.

The environment 100 includes a controller 124 with current and/or voltage sensing capabilities. For example, the controller 124 may be integrated with, or in communication with, voltage meters and/or current meters (e.g., ammeters) to measure the voltage (V_AN, V_BN, V_CN) and/or currents I_A, I_B, I_C on the connectors 120. The controller 124 measures the voltages and currents of the three phases A, B, C via probe lines 126, 128 connected to connectors 120, 122.

The controller 124 may be communicatively connected with one or more meters 130 via a communications link 132. Although the communications link 132 is depicted as a controller area network (CAN) link, it should be understood that any suitable wired or wireless communications link may be used to couple the controller 124 to the one or more meters 130. The meters 130 may be configured to measure currents and/or voltages on the inverter/load side 110 of the transformer 106 and/or on the power grid side 108 of the transformer 106 via probe lines 134, 136. The controller 124 may be configured to receive current and/or voltage measurements from the one or meters 130 via the communications link 132. In alternate configurations, the controller 124 may be in the location of the one or more meters 130 and the one or more meters 130 may provide current and/or voltage measurements on the power grid side 108 of the transformer 106 to the controller 124 via the communications link 132. In yet other configurations, the controller 124 may be configured to determine the current and/or voltage measurements on both the power grid side 108 and the inverter/load side 110 of the transformer 106. In some cases, the environment 100 may also include one or more relays and/or connectors (not shown) to disconnect one or more elements of environment 100, such as the inverters 102, the transformer 106, or the like, from the power grid 104, such as when an open phase condition is detected.

According to examples of the disclosure, the controller 124 may repeatedly take measurements of the current and/or voltage on the power grid side 108 of the transformer 106, such as on the wye winding 112 of the transformer 106. The controller 124 may further repeatedly receive from the one or more meters 130, or alternatively measure, the current and/or voltage on the inverter/load side 110 of the transformer 106. The controller 124 may be configured to use the current and/or voltage measurements on both the power grid side 108 and the inverter/load side 110 of the transformer 106 to determine if an open phase condition exists on the power grid side 108 of the transformer 106. If the currents on the power grid side 108 of the transformer 106 are imbalanced, but the currents on the inverter/load side 110 of the transformer 106 are balanced, then the controller 124 may determine that an open phase condition exists. Imbalanced currents, as used herein, may indicate a situation where the current through one of the phases A, B, C is less than the other two phases A, B, C. In some cases, the current through one of the phases A, B, C may be substantially zero, while the current through the other two phases A, B, C may be substantially non-zero.

The controller 124 may cause a notification (e.g., sound an alarm) and/or disconnect one or more elements of environment 100 from the power grid 104 if an open phase condition is detected. By being able to detect the open phase condition, the controller 124 allows for prevention of damage to equipment, such as the transformer 106 and/or damage to the power grid 104. Furthermore, the controller enables compliance with grid codes that require monitoring for open phase conditions when power is supplied to the power grid 104.

Figure 2:
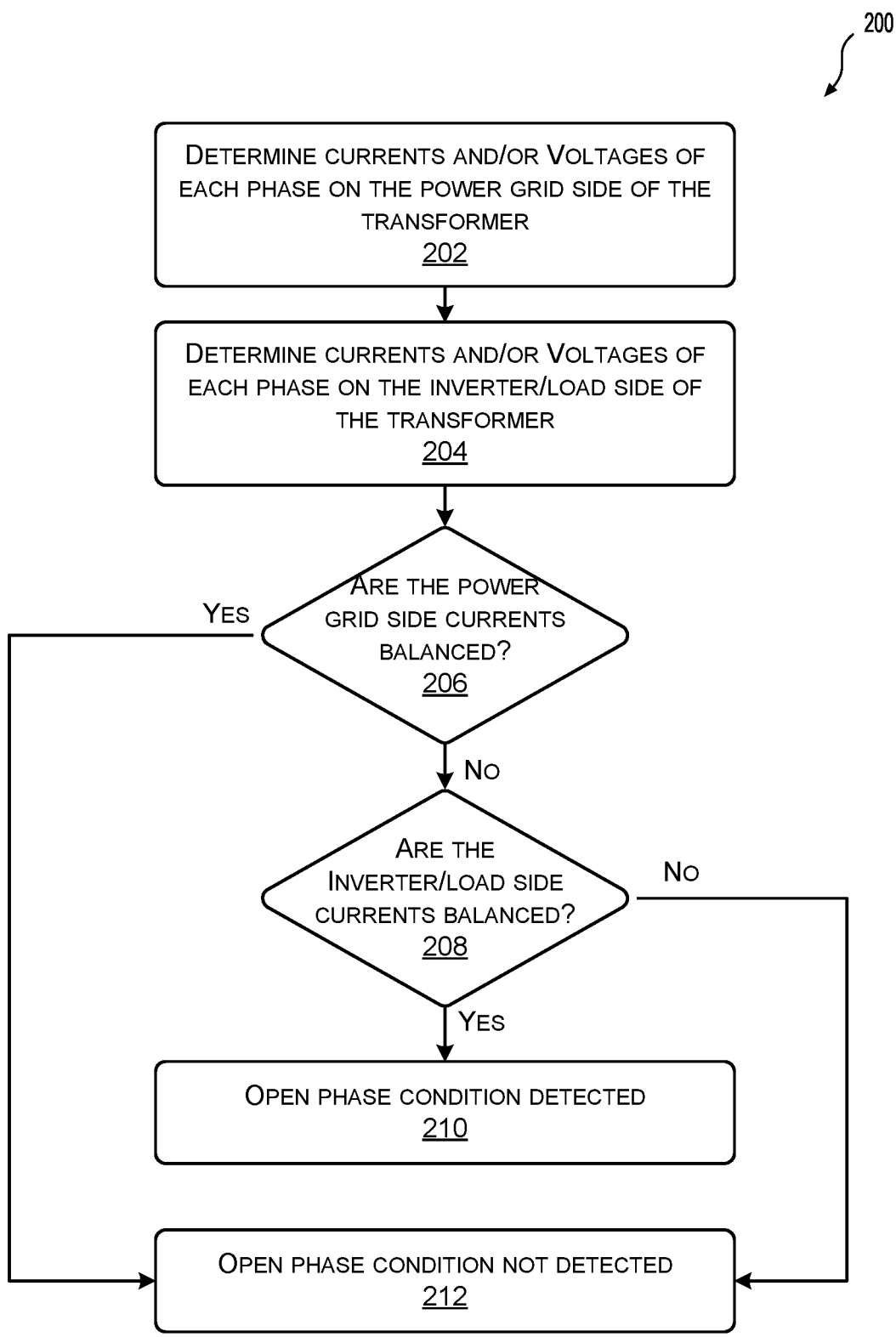
FIG. 2 is a flow diagram depicting an example method for detecting an open phase condition in the transformer depicted in FIG. 1, according to examples of the disclosure.

FIG. 2 is a flow diagram depicting an example method 200 for detecting an open phase condition in the transformer 106 depicted in FIG. 1, according to examples of the disclosure. The method 200 may be performed by the controller 124, in cooperation with one or more other entities of the environment 100, such as meters 130.

At block 202, the controller 124 determines the currents and/or voltages of each phase A, B, C on the power grid side 108 of the transformer 106. The power grid side 108 may include one of more wye winding(s) 112 that are magnetically coupled to one or more delta winding(s) 114 on the inverter/load side 110 of the transformer 106. The currents on each of the three phases A, B, C on the power grid side 108 may be directly measured by the controller 124, or alternatively the current measurements may be received from the one or more meters 130.

At block 204, the controller 124 determines the currents and/or voltages of each phase A, B, C on the inverter/load side 110 of the transformer 106. The inverter/load side 110 may include one of more delta winding(s) 114 that are magnetically coupled to one or more wye winding(s) 112 on the power grid side 110 of the transformer 106. The currents on each of the three phases A, B, C on the inverter/load side 110 may be measured by the meters 130, or alternatively directly measured by the controller 124.

At block 206, the controller 124 determines whether the power grid side 108 currents are balanced. Whether the power grid side 108 currents are balanced may be determined by comparing each of the measured currents of each of the phases A, B, C on the power grid side 108, which may be the wye side of the transformer 106. Imbalanced currents may be detected if the current through one of the phases A, B, C is less than the other two phases A, B, C on the power grid side 108 by a threshold amount. In some cases, the current through one of the phases A, B, C may be substantially zero, while the currents through the other two phases A, B, C may be substantially non-zero to indicate an unbalanced current condition on the power grid side 108 of the transformer 106. In other cases, the current through one of the phases A, B, C may be less than 50% of the currents through the other two phases A, B, C to indicate an unbalanced current condition on the power grid side 108 of the transformer 106. In yet other cases, the current through one of the phases A, B, C may be less than 25% of the currents through the other two phases A, B, C to indicate an unbalanced current condition on the power grid side 108 of the transformer 106. In still other cases, the current through one of the phases A, B, C may be less than 10% of the currents through the other two phases A, B, C to indicate an unbalanced current condition on the power grid side 108 of the transformer 106. For example, the current on phase A may be measured as 32.02 Amps, the current on phase B may be measured as 0.04 Amps, and the current on phase C may be measured as 29.73 Amps. In this case, the currents on the power grid side 108 of the transformer 106 may be deemed unbalanced, since the current on phase B is less than 10% of the current on either phase A or phase C.

If it is determined at block 206 that the currents on the power grid side 108 of the transformer 106 are balanced, then the method 200 may proceed to block 212, where the controller 124 determines that an open phase condition does not exist with the transformer 106 connected to the power grid 104. If, on the other hand, the controller 124 determines at block 206 that the currents on the power grid side 108 are imbalanced, then the method 200 may proceed to block 208 where the controller 124 determines whether the inverter/load side 110 currents of the transformer 106 are balanced.

Similar to the case on the power grid side 108 of the transformer, imbalanced currents may be detected if the current through one of the phases A, B, C on the inverter/load side 110 is less than the other two phases A, B, C by a threshold amount. In some cases, the current through one of the phases A, B, C may be substantially zero, while the currents through the other two phases A, B, C may be substantially non-zero to indicate an unbalanced current condition on the inverter/load side 110 of the transformer 106. In other cases, the current through one of the phases A, B, C may be less than 50% of the currents through the other two phases A, B, C to indicate an unbalanced current condition on the inverter/load side 110 of the transformer 106. In yet other cases, the current through one of the phases A, B, C may be less than 25% of the currents through the other two phases A, B, C to indicate an unbalanced current condition on the inverter/load side 110 of the transformer 106. In still other cases, the current through one of the phases A, B, C may be less than 10% of the currents through the other two phases A, B, C to indicate an unbalanced current condition on the inverter/load side 110 of the transformer 106. For example, the current on phase A may be measured as 4.43 Amps, the current on phase B may be measured as 4.52 Amps, and the current on phase C may be measured as 0.02 Amps. In this case, the currents on the power grid side 108 of the transformer 106 may be deemed unbalanced, since the current on phase C is less than 25% of the current on either phase A or phase B.

If, at block 208, the controller 124 determines that the currents on the inverter/load side 110 of the transformer 106 are not balanced, then the method 200 proceeds to block 212, where an open phase condition is not detected. In other words, the transformer 106, in this case, may be properly connected to the power grid 104 and operating normally. However, if the controller determines at block 208 that the inverter/load side 110 currents of the transformer 106 are balanced, then the controller 124, at block 210, determines that an open phase condition exists.

Thus, it should be understood that the controller 124 identifies an open phase condition when power grid side 108 currents (e.g., the wye side currents) are imbalanced and the inverter/load side 110 currents (e.g., the delta side currents) are balanced. However, if the power grid side 108 currents (e.g., the wye side currents) are balanced, the controller 124 determines that no open phase condition exists, regardless of whether the inverter/load side 110 currents (e.g., delta side currents) are balanced or not. Additionally, if the inverter/load side 110 currents (e.g., the delta side currents) are imbalanced, the controller 124 determines that no open phase condition exists, regardless of whether the power grid side 108 currents (e.g., wye side currents) are balanced or not.

It will be appreciated that the method 200 may be performed in a repeated fashion with any suitable frequency to continuously and/or intermittently monitor the open phase status of the transformer 106. Repetition of the method 200 may be with any suitable frequency, such as every second, every 30 seconds, every minute, every 30 minutes, every hour, or the like. In some cases, the controller 124 may disconnect, such as by controlling a relay and/or connector switch, one or more elements of environment 100, such as inverters 102 and/or the transformer 106, from the power grid 104, when an open phase condition is detected. In other cases, the controller may indicate that an open phase condition exists, by way of an alarm and/or user interface, when an open phase condition is detected.

It should be noted that some of the operations of method 200 may be performed out of the order presented, with additional elements, and/or without some elements. Some of the operations of method 200 may further take place substantially concurrently and, therefore, may conclude in an order different from the order of operations shown above. For example, the processes of blocks 202 and 204 may be performed substantially concurrently and/or in reverse order, according to examples of the disclosure. Additionally, the processes of blocks 206 and 208 may also be performed substantially concurrently and/or in reverse order, according to examples of the disclosure.

It should be noted that the method 200 provides a robust detection of an open phase condition of a grid-tied transformer 106 with no or minimal additional hardware and/or processes to perform. The method 200 relies on measurements and analysis of currents on either side of the transformer 106, thus obviating additional, non-standard processes and/or equipment needs.

Figure 3:
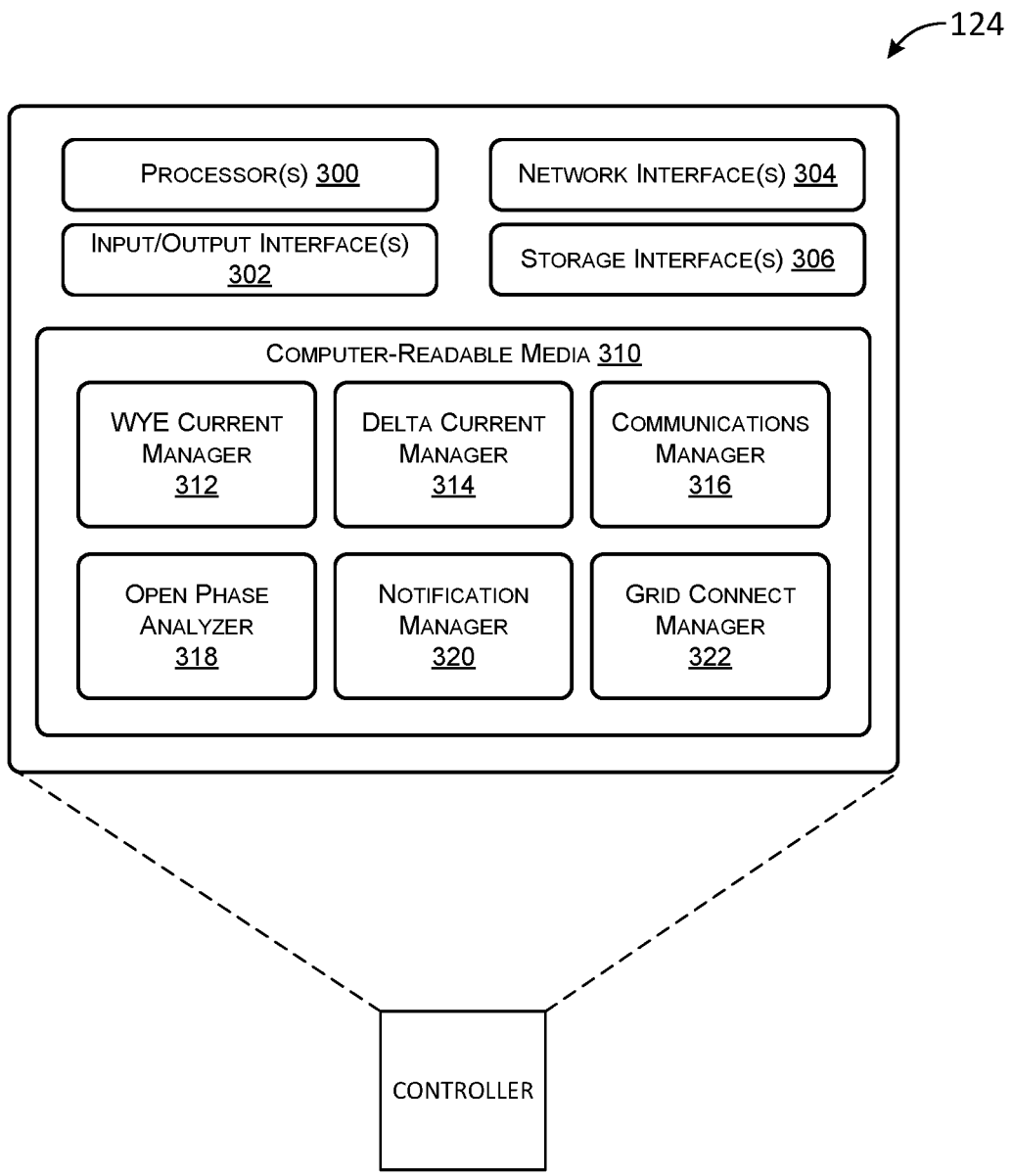
FIG. 3 is a block diagram of a controller depicted in FIG. 1 for identifying an open phase condition of the transformer connected to the power grid, according to examples of the disclosure.

FIG. 3 is a block diagram of the controller 124 depicted in FIG. 1 for identifying an open phase condition of the transformer 106 connected to the power grid 104, according to examples of the disclosure. The controller 124 may include one or more processor(s) 300, one or more input/output (I/O) interface(s) 302, one or more network interface(s) 304, one or more storage interface(s) 306, and computer-readable media 310.

In some implementations, the processors(s) 300 may include a central processing unit (CPU), a graphics processing unit (GPU), both CPU and GPU, a microprocessor, a digital signal processor or other processing units or components known in the art. Alternatively, or in addition, the functionally described herein can be performed, at least in part, by one or more hardware logic components. For example, and without limitation, illustrative types of hardware logic components that may be used include field-programmable gate arrays (FPGAs), application-specific integrated circuits (ASICs), application-specific standard products (ASSPs), system-on-a-chip system(s) (SOCs), complex programmable logic devices (CPLDs), etc. Additionally, each of the processor(s) 300 may possess its own local memory, which also may store program modules, program data, and/or one or more operating system(s). The one or more processor(s) 300 may include one or more cores.

The one or more input/output (I/O) interface(s) 302 may enable the controller 124 to detect interaction with a user and/or other system(s), such as a smartphone of an individual and/or operator of the transformer 106. The I/O interface(s) 302 may include a combination of hardware, software, and/or firmware and may include software drivers for enabling the operation of any variety of I/O device(s) integrated on the controller 124 or with which the controller 124 interacts, such as displays, microphones, speakers, cameras, switches, and any other variety of sensors, or the like. In some cases, the I/O interface(s) 302 enables the indication, such as in the form of an indicia on an I/O device and/or an alarm, a detected open phase condition, according to the disclosure herein.

The network interface(s) 304 may enable the controller 124 to communicate via the one or more network(s). The network interface(s) 304 may include a combination of hardware, software, and/or firmware and may include software drivers for enabling any variety of protocol-based communications, and any variety of wireline and/or wireless ports/antennas. For example, the network interface(s) 304 may comprise one or more of a cellular radio, a wireless (e.g., IEEE 802.1x-based) interface, a Bluetooth® interface, and the like. In some embodiments, the network interface(s) 506 may include radio frequency (RF) circuitry that allows the controller 124 to transition between various standards. The network interface(s) 304 may further enable the controller 124 to communicate over circuit-switch domains and/or packet-switch domains. In examples of the disclosure, the network interface 304 may enable the controller to communicate with the meters 130 via the communications link 132, such as a CAN link.

The storage interface(s) 306 may enable the processor(s) 300 to interface and exchange data with the computer-readable medium 310, as well as any storage device(s) external to the controller 124, such as any datastore storing time series current and/or voltage data.

The computer-readable media 310 may include volatile and/or nonvolatile memory, removable and non-removable media implemented in any method or technology for storage of information, such as computer-readable instructions, data structures, program modules, or other data. Such memory includes, but is not limited to, RAM, ROM, EEPROM, flash memory or other memory technology, CD-ROM, digital versatile discs (DVD) or other optical storage, magnetic cassettes, magnetic tape, magnetic disk storage or other magnetic storage devices, RAID storage system(s), or any other medium which can be used to store the desired information and which can be accessed by a computing device. The computer-readable media 310 may be implemented as computer-readable storage media (CRSM), which may be any available physical media accessible by the processor(s) 300 to execute instructions stored on the computer-readable media 310. In one basic implementation, CRSM may include random access memory (RAM) and Flash memory. In other implementations, CRSM may include, but is not limited to, read-only memory (ROM), electrically erasable programmable read-only memory (EEPROM), or any other tangible medium which can be used to store the desired information and which can be accessed by the processor(s) 300. The computer-readable media 310 may have an operating system (OS) and/or a variety of suitable applications stored thereon. The OS, when executed by the processor(s) 300 may enable management of hardware and/or software resources of the controller 124.

Several functional blocks having instruction, data stores, and so forth may be stored within the computer-readable media 310 and configured to execute on the processor(s) 300. The computer readable media 310 may have stored thereon a wye current manager 312, a delta current manager 314, a communications manager 316, an open phase analyzer 318, a notification manager 320, and a grid connect manager 322. It will be appreciated that each of the functional blocks 312, 314, 316, 318, 320, 322, may have instructions stored thereon that when executed by the processor(s) 300 may enable various functions pertaining to the operations of the controller 124.

The instructions stored in the wye current manager 312, when executed by the processor(s) 300, may configure the controller 124 to measure and/or receive current values and/or voltage values of the three phases A, B, C on the wye side and/or the power grid side 108 of the transformer 106. The processor(s) 300 may also store and/or manage the measured or received measurements of current and/or voltage on the wye side of the transformer 106 to determine whether the currents on the wye side of the transformer 106 are imbalanced. In some cases, the processor(s) 300 may facilitate receiving the current measurement data from other entities of environment 100, such as the one or more meters 130. The processor(s) 300 may also be configured to operate ammeters and/or volt meters associated with (e.g., integrated with or in communications with) the controller 124.

The instructions stored in the delta current manager 314, when executed by the processor(s) 300, may configure the controller 124 to measure and/or receive current values and/or voltage values of the three phases A, B, C on the delta side and/or the inverter/load side 110 of the transformer 106. The processor(s) 300 may also store and/or manage the measured or received measurements of current and/or voltage on the delta side of the transformer 106 to determine whether the currents on the delta side of the transformer 106 are imbalanced. In some cases, the processor(s) 300 may facilitate receiving the current measurement data from other entities of environment 100, such as the one or more meters 130. The processor(s) 300 may also be configured to operate ammeters and/or volt meters associated with (e.g., integrated with or in communications with) the controller 124.

The instructions stored in the communications manager 316, when executed by the processor(s) 300, may configure the controller 124 to communicate with one or more other entities of the environment 100, such as meters 130 or other ammeters and/or volt meters that may be provided to take any of the measurements of current or voltage used herein. The processor(s) 300 may be configured to communicate via the communications link 132, such as a CAN link or any other suitable wired or wireless communications mechanisms. The processor(s) 300 may also be configured to communicate with one or more other entities outside of environment 100, such as remote monitoring devices that may be notified if an open phase condition is detected.

The instructions stored in the open phase analyzer 318, when executed by the processor(s) 300, may configure the controller 124 to determine, based at least in part on current measurements on the wye side and the delta side of the transformer 106, whether an open phase condition exists. The processor(s) 300 may determine whether the current on the three phases on the wye side of the transformer 106 are balanced. Similarly, the processor(s) 300 may determine whether the current on the three phases on the delta side of the transformer 106 are balanced. Whether the currents are balanced may be determined by the processor(s) 300 by determining if the current on one of the three phases is different from the current on the other three phases by at least a threshold value. In other cases, the processor(s) 300 may determine whether the currents of the three phases are imbalanced by determining if the current on one of the three phases is substantially zero, while the currents on the other two phases are substantially non-zero. If it is determined that the currents on the wye side of the transformer 106 is imbalanced, while the currents on the delta side of the transformer 106 are balanced, then the processor(s) 300 may determine that an open phase condition occurred. Otherwise, the processor(s) 300 may determine that an open phase condition has not arisen.

The instructions stored in the notification manager 320, when executed by the processor(s) 300, may configure the controller 124 to notify one or more entities of an open phase condition. The processor(s) 300 may control a user interface associated with the controller 124, such as a display output, light, and/or alarm to indicate the open phase conditions. The processor(s) 300 may also be configured to send a signal to one or more other device(s), such as personal electronic devices (e.g., smartphones), of individuals and/or operators associated with the transformer 106 to notify them of the open phase condition of the transformer 106.

The instructions stored in the grid connect manager 322, when executed by the processor(s) 300, may configure the controller 124 to control one or more switches, such as a relay, connector, solid-state switch, etc., to disconnect one or more elements of environment 100 from the power grid 104, when an open phase condition is detected. The processor(s) 300 may be able to disconnect one or more elements of the environment 100 from the power grid 104 more quickly than what a human operator may be able to do once they hear or see an alarm indicating an open phase condition.

INDUSTRIAL APPLICABILITY

The present disclosure describes systems, structures, and methods to quickly and efficiently detect an open phase condition when a transformer 106, such as a delta-wye transformer is connected to a power grid 104. Because of magnetic flux stabilizing current flow through the delta side and/or the wye side of the transformer 106, one cannot merely measure the current and/or voltage on the high-voltage side of the transformer 106 to assess whether an open phase condition exists. This may especially be true with a no load or low load configuration of the transformer 106, where a sufficient change in currents and/or voltages may not be detected reliably to predict the occurrence of an open phase condition. However, it is desirable to be able to reliably detect open phase conditions when connecting generations units, inverters 102, and/or loads via the transformer 106 to the power grid 104. Additionally, grid codes in many jurisdictions require grid-tied point-of-use systems to monitor for open phase conditions. Thus, the systems and methods, as described herein, enable reliable monitoring of open phase conditions to reduce the chances of damage to point-of-use systems and/or power grid equipment and to remain in compliance with grid codes.

Additionally, the systems and methods, as described herein, may not require significant additional equipment and/or nonstandard processes. For example, additional coupling to the transformer 106 may not be needed to determine load currents with different loading conditions. Additionally, the transformer 106 and/or the neutral connection does not need to be provided with an injection current to monitor open phase conditions. This reduces the design complexity, equipment needs, and/or the cost associated with the open phase detection system and methods, as discussed herein. The open phase detection system, as discussed herein, relies on comparing wye side currents (e.g., power grid side 108 currents) with delta side currents (e.g., inverter/load side 110 currents) to detect an open phase, resulting in a robust, reliable, and low-overhead solution.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein.

What is claimed is:

1. A method of detecting an open phase condition, comprising:
    measuring, using one or more meters, a first current value, a second current value, and a third current value associated with a first side of a transformer;
    measuring, using the one or more meters, a fourth current value, a fifth current value, and a sixth current value associated with a second side of the transformer;
    determining, by a controller, that the first current value, the second current value, and the third current value are imbalanced by determining that one of the first current value, the second current value, or the third current value is greater than a threshold value different from the other two of the first current value, the second current value, or the third current value;
    determining, by the controller, that the fourth current value, the fifth current value, and the sixth current value are balanced;
    determining, by the controller and based at least in part on first current value, the second current value, and the third current value being imbalanced and the fourth current value, the fifth current value, and the sixth current value being balanced, that an open phase condition exists on the first side of the transformer; and
    disconnecting, by the controller and based at least in part on determining that the open phase condition exists, the transformer from a power grid or an inverter by actuating a relay or connector switch.

2. The method of claim 1, wherein the first side of the transformer is a power grid side of the transformer and the second side of the transformer is an inverter/load side of the transformer.

3. The method of claim 1, wherein the first side of the transformer includes a wye winding and the second side of the transformer includes a delta winding coupled to the wye winding.

4. The method of claim 1, wherein the first current value is associated with a first phase of a power grid, the second current value is associated with a second phase of the power grid, and the third current value is associated with a third phase of the power grid.

5. The method of claim 1, further comprising:
    indicating, based at least in part on determining that the open phase condition exists on the first side of the transformer, that the open phase condition has been detected.

6. The method of claim 1, wherein determining that the first current value, the second current value, and the third current value are imbalanced further comprises:
    determining that one of the first current value, the second current value, or the third current value is substantially zero, while the other two of the first current value, the second current value, or the third current value are substantially non-zero.

7. The method of claim 1, wherein determining that the fourth current value, the fifth current value, and the sixth current value are balanced further comprises:
    determining that each of the fourth current value, the fifth current value, and the sixth current value are within the threshold value of each other.

8. The method of claim 1, further comprising:
    sending, by the controller and to an electronic device, a notification to indicate the open phase condition.

9. A system, comprising:
    one or more meters;
    a transformer having a power grid side and an inverter/load side; and
    a controller configured to:
        measure, using the one or more meters, a first current value, a second current value, and a third current value associated with power grid side of the transformer;
        measure, using the one or more meters, a fourth current value, a fifth current value, and a sixth current value associated with inverter/load side of the transformer;
        determine that the first current value, the second current value, and the third current value are imbalanced by determining that one of the first current value, the second current value, or the third current value is greater than a threshold value different from the other two of the first current value, the second current value, or the third current value;
        determine that the fourth current value, the fifth current value, and the sixth current value are balanced;
        determine, based at least in part on first current value, the second current value, and the third current value being imbalanced and the fourth current value, the fifth current value, and the sixth current value being balanced, that an open phase condition exists on the power grid side of the transformer; and
        disconnect, based at least in part on the open phase condition, the transformer from a power grid or an inverter from the transformer.

10. The system of claim 9, further comprising:
    a wye winding on the power grid side of the transformer; and
    a delta winding on the inverter/load side of the transformer.

11. The system of claim 9, wherein the controller is further configured to:
    indicate, based at least in part on determining that the open phase condition exists on the power grid side of the transformer, that the open phase condition has been detected.

12. The system of claim 9, wherein to determine that the first current value, the second current value, and the third current value are imbalanced, the controller is further configured to:
    determine that one of the first current value, the second current value, or the third current value is substantially zero, while the other two of the first current value, the second current value, or the third current value are substantially non-zero.

13. The system of claim 9,
wherein the controller is further configured to:
receive, from the one or more meters, the fourth current value, the fifth current value, and the sixth current value.

14. The system of claim 9, wherein the controller is further configured to:
measure, at a second time and using the one or more meters, the first current value, the second current value, and the third current value associated with power grid side of the transformer; and
determine, at the second time, that the that the transformer is operating without an open phase condition at the second time.

15. A system, comprising:
one or more meters;
a transformer having a wye side and a delta side; and
a controller configured to:
determine, using the one or more meters and at a first time, a first current value of a first phase on the wye side, a second current value of a second phase on the wye side, and a third current value of a third phase on the wye side;
determine, using the one or more meters and at the first time, a fourth current value of the first phase on the delta side, a fifth current value of the second phase on the delta side, and a sixth current value of the third phase on the delta side;
determine that the first current value, the second current value, and the third current value are imbalanced by determining that one of the first current value, the second current value, or the third current value is greater than a threshold value different from the other two of the first current value, the second current value, or the third current value;
determine, using the one or more meters, that the fourth current value, the fifth current value, and the sixth current value are imbalanced; and
determine, based at least in part on first current value, the second current value, and the third current value being imbalanced and the fourth current value, the fifth current value, and the sixth current value being imbalanced, that the transformer is operating without an open phase condition at the first time.

16. The system of claim 15, wherein the controller is further configured to:
determine, at a second time, a seventh current value of the first phase on the wye side, an eighth current value of the second phase on the wye side, and a ninth current value of the third phase on the wye side;
determine, at the second time, a tenth current value of the first phase on the delta side, an eleventh current value of the second phase on the delta side, and a twelfth current value of the third phase on the delta side;
determine that the seventh current value, the eighth current value, and the ninth current value are imbalanced;
determine that the tenth current value, the eleventh current value, and the twelfth current value are balanced; and
determine, based at least in part on seventh current value, the eighth current value, and the ninth current value being imbalanced and the tenth current value, the eleventh current value, and the twelfth current value being balanced, that an open phase condition exists on a power grid side of the transformer at the second time.

17. The system of claim 16, wherein the controller is further configured to:
indicate, based at least in part on determining that the open phase condition exists on the power grid side of the transformer at the second time, that an open phase condition has been detected.

18. The system of claim 16, determine that one of the seventh current value, the eighth current value, or the ninth current value is greater than a threshold value different from the other two of the seventh current value, the eighth current value, or the ninth current value.

19. The system of claim 16, wherein the controller is further configured to:
disconnect, based at least in part on determining that the open phase condition exists at the second time, the transformer from a power grid or an inverter from the transformer.

20. The system of claim 15, wherein the wye side of the transformer is a power grid side of the transformer and the delta side of the transformer is an load side of the transformer.

* * * * *